US006028478A

United States Patent [19]

Seremeta et al.

[11] Patent Number: 6,028,478

[45] Date of Patent: Feb. 22, 2000

[54] CONVERTER CIRCUIT AND VARIABLE GAIN AMPLIFIER WITH TEMPERATURE COMPENSATION

[75] Inventors: Dorin Seremeta, Cupertino; Rudolphe Gustave Eschauzier, Santa Clara, both of Calif.

[73] Assignee: Philips Electronics North America Corporation, New York, N.Y.

[21] Appl. No.: 09/114,750

[22] Filed: Jul. 13, 1998

[51] Int. Cl.[7] .................................................. H03F 3/45

[52] U.S. Cl. ........................................ 330/252; 330/254

[58] Field of Search ................................ 330/254, 252; 327/356, 359

[56] References Cited

U.S. PATENT DOCUMENTS

| | | | |
|---|---|---|---|
| 4,516,081 | 5/1985 | Katakura | 330/254 |
| 4,878,031 | 10/1989 | Main | 330/254 |
| 5,302,868 | 4/1994 | Fergus | 307/491 |
| 5,532,644 | 7/1996 | Nakagawara | 330/254 |
| 5,606,272 | 2/1997 | Behbahani et al. | 327/65 |

FOREIGN PATENT DOCUMENTS

| | | | |
|---|---|---|---|
| 9007231 | 6/1990 | WIPO | H03F 3/45 |

OTHER PUBLICATIONS

"Current–Mode Circuits From A Translinear Viewpoint: A Tutorial", by Barrie Gilber, Chapter 2, Peter Peregrinus Ltd (UK 1990).

*Primary Examiner*—Robert Pascal
*Assistant Examiner*—Henry Choe
*Attorney, Agent, or Firm*—Brian J. Wieghaus

[57] ABSTRACT

A voltage converting multiplier circuit converts a single ended input voltage $V_{gain}$ into a differential output voltage $V_{DO}$, and includes a differential input cell and a differential output cell, each biased by a respective control current. A control circuit includes an input device having a resistance $R_{in}$ coupled to an input terminal, and a differential amplifier which controls the differential input cell to maintain a voltage at one end of the input device equal to a reference voltage $V_{REF}$, so as to convert the input voltage into an input current dI equal to $(V_{REF}-V_{in})/R_1$. A current mirror ensures that the input current is supplied by the branches of the differential input cell, which current splitting is mirrored to the differential output cell. An output device having a resistance $R_{out}$ in each branch of the differential output cell converts the differential output current to the differential output voltage $V_{DO}$, where $V_{DO}=V_{in}(R_{out}/R_{in})(I_{cout}/I_{cin})$ where $I_{cout}$ and $I_{cin}$ are the control currents applied to the differential input and output cells, respectively. A temperature compensated voltage is achieved where $I_{cin}$ is a constant current and $I_{cout}$ is a temperature compensated current. A temperature compensated variable gain amplifier including the converter circuit is also disclosed.

24 Claims, 2 Drawing Sheets

CONVERTER CIRCUIT AND VARIABLE GAIN AMPLIFIER WITH TEMPERATURE COMPENSATION

BACKGROUND OF THE INVENTION

1. Field of the Invention

The invention concerns converter circuits which convert a single ended voltage to a differential output. More particularly, the invention concerns reducing circuit complexity and size of such a converter circuit while providing temperature compensation. The invention also concerns a variable gain amplifier ("VGA") with such a converter circuit.

2. Description of the Prior Art

Many communication applications require some sort of variable gain that is a exponentially proportional to an input control voltage. Since on a dB scale the gain curve becomes a straight line, this is commonly referred to as "linear-in-dB". An example of where a linear-in-dB variable gain is required is in transceivers for cellular phones. A VGA is used in the automatic gain control loop of the transmitter to regulate the power of the signal transmitted from the cellular phone. A VGA is also used in the receiver to regulate the signal power for the intermediate-frequency (IF) and signal dividing stages of the receiver despite a varying input power of the received RF signal.

Most VGA circuits accomplish this desired linear-in-dB behavior by, one way or another, exploiting the exponential characteristic of a bipolar transistor. A well-known technique relies on the fact that the ratio of the collector currents of a bipolar differential pair is exponentially dependant on the differential input voltage. FIG. 1 shows a differential pair of bipolar transistors Q1 and Q2 with common emitters biased by a tail current Itail from current source 5 and their bases controlled by a differential input voltage vin+, vin− at differential inputs 1,2. The relation between the collector currents iout+ and iout− at the outputs 3, 4 and the input voltages vin+ and vin− can be described as $$\frac{I_{out-}}{I_{out+}} = e^{\frac{q(V_{in+}-V_{in-})}{kT}} \tag{1}$$

where q is the charge of an electron, k is Boltzmann's constant and T represents the absolute temperature. The fact that it is the ratio of the collector currents that exhibits the linear-in-dB behavior enables the bipolar differential pair to be used for a wide range of variable gain circuits that rely on current ratios to set their gain. A classic and widely-used example of such a circuit is the translinear Gilbert multiplier cell known, inter alia, from, B. Gilbert, "Analog IC Design, the Current Mode Approach", Chapter 2, Peter Peregrinus Ltd (U.K. 1990).

Equation 1 clearly shows the exponential characteristic of the circuit. It also reveals another important aspect. The presence of the absolute temperature T, in the denominator of the right hand side argument, indicates that the collector current ratio is not only a function of the differential input voltage, but also of the operating temperature. This temperature effect can be quite significant, as circuits are commonly required to operate over a temperature range between about 230° K. and 380° K. The mathematical solution to the temperature sensitivity of Eq. 1 is relatively simple: multiplying the differential input voltage with a factor that is proportional to the absolute temperature cancels out the absolute temperature T in the denominator. In other words, if $$f(T)=cT \tag{2}$$

where c is an arbitrary constant, then by multiplying the differential input voltage with f(T), Eq. 1 becomes $$\frac{I_{out-}}{I_{out+}} = e^{\frac{q(V_{in+}-V_{in-})f(T)}{kT}} = e^{\frac{cq(V_{in+}-V_{in-})T}{kT}} = e^{\frac{cq(V_{in+}-V_{in-})}{k}} \tag{3}$$

The right hand term of Eq. 3, apart from the constants, relies on the input voltage alone and has become independent of the temperature.

A known way to realize the temperature cancellation principle of Eq. 3 in a physical circuit is shown in FIGS. 2(*a*), 2(*b*). FIG. 2(*b*) represents a Gilbert multiplier that multiplies an incoming control signal by a factor that equals the ratio of the two currents Iconst and Iptat. If the current "Iconst" is constant over temperature and "Iptat" is proportional to the absolute temperature T (PTAT), this ratio becomes the desired linear function of the temperature:

$$f(T) = \frac{I_{ptat}}{I_{const}} = cT \tag{4}$$

Unfortunately, the known multiplier of FIG. 2(*b*) only accepts a differential current (I0+dI, I0−dI) at its input 12, 13, whereas the required control input for most variable gain amplifiers is single-ended voltage. This disparity accounts for the added circuitry shown in FIG. 2(*a*), which is a schematic of a traditional voltage-to-current convertor with single-ended input and differential output. The circuit of FIG. 2(*a*) is known from: Gurkanwal Singh Sahota, Charles James Persico, "High Dynamic Range Variable-Gain Amplifier for CDMA Wireless Applications", proceeding ISSCC (U.S.A. 1997). To understand the operation of the circuit of FIG. 2(*a*), assume that the amplifier A1 has sufficient gain to keep the voltage at its positive input equal to the reference voltage $V_{ref}$ at its negative input. In that case, the voltage at the right hand terminal of the input resistor R1 becomes $V_{ref}$. Since the other terminal of the resistor R1 is connected to the input terminal 9 which receives the gain control voltage $V_{gain}$, there will be a voltage drop of $V_{ref}$−$V_{gain}$ across the resistor R1, which causes a current dI to be taken away from the circuit. This current dI is supplied by the transistor Q3, together with the constant bias current I0. The total current at the collector of the transistor Q3 is therefore I0+dI.

In case the voltage at the positive input of the amplifier A1 inadvertently deviates from the assumed voltage $V_{ref}$, the feedback loop formed by the transistors Q1, Q2 and Q3 will adjust the collector current of the transistor Q3 until the voltage at the positive input of the amplifier A1 is corrected to $V_{ref}$. Due to the parallel connections of the base and emitter terminals of the transistors Q3 and Q4, the collector current of the transistor Q4 will track that of the transistor Q3. Thus, a current of I0+dI will flow out of the first output terminal 10 of the voltage-to-current converter.

The transistor Q5 also copies the collector current of the transistor Q3. In this case, however, the current I0+dI is directed through the current mirror formed by the transistors Q6/Q7, and then subtracted from a constant bias current 2I0. The result at the second output terminal 11 is a current that equals I0−dI. The total differential output current of the circuit in FIG. 2(*a*) is ((I0+dI−(I0−dI)), or 2dI, which can be used to directly drive the Gilbert multiplier of FIG. 2(*b*).

Looking more closely at the voltage-to-current converter of FIG. 2(*a*), several drawbacks become apparent, most of them related to the accuracy of the circuit. First, the voltages at the collectors of the transistors Q2, Q3, Q4 and Q5 are all different, leading to small but significant differences in the collector currents of the respective transistors. This causes an error in the overall gain setting of the variable gain amplifier. In the same way, integrated circuit process related random mismatches between any of the devices Q2–Q5 will adversely affect the accuracy. A second drawback stems from the fact that the current coming out of the transistor Q5 is first mirrored by the transistors Q6 and Q7, while the current from the transistor Q4 is directly flowing to the output terminal 10 without first being mirrored by a current mirror. Not only will any random mismatch between the transistors Q6 and Q7 deteriorate the overall performance, but also here, the collector voltages of the two current mirror transistors Q6, Q7 are not identical, adding to the total error. A final, more general, drawback involves the complexity of the circuit. Combining the two schematics of FIG. 2 (*a*) and FIG. 2 (*b*) typically yields a block that consumes a considerable part of the total die area of a VGA.

SUMMARY OF THE INVENTION

Generally speaking, according to one aspect of the invention, a voltage converting multiplier circuit includes a multiplier circuit comprising a differential input cell and a differential output cell coupled in a pair wise configuration. Each differential cell includes an inverting input, a non-inverting input, an inverting output and a non-inverting output, and a control current terminal. An input terminal receives an input voltage $V_{gain}$ and a control circuit receives a reference voltage $V_{ref}$, converts the input voltage to an input current dI proportional to the difference between the reference voltage $V_{ref}$ and the input voltage $V_{in}$, equally divides the input current and applies the divided input current to the inverting and non-inverting outputs of the differential input cell such that the inverting and non-inverting outputs of the differential output cell output a differential output current $I_{out}$ proportional to dI $(I_{cout}/I_{cin})$, where $I_{cout}$ is a control current applied to the control current terminal of the differential output cell and $I_{cin}$ is a control current applied to the control current terminal of the differential input cell.

Instead of first converting a single ended input voltage to a differential output current to be applied to the input cell of a multiplier circuit as in the known configuration of FIG. 2, the circuit according to the invention controls an input cell of a multiplier circuit to convert a single ended input voltage to an input current, which input current is split to provide a differential current in the first cell which is mirrored to the output cell. This technique allows for reducing component count as well as improving circuit accuracy as compared to the known circuit.

According to another aspect of the invention, the control circuit includes an input device having resistance $R_{in}$ coupled to the input terminal, and a differential amplifier which controls the differential input cell to maintain a voltage at one end of the input device equal to a reference voltage $V_{REF}$, so as to convert the input voltage into the input current dI equal to $(V_{REF}-V_{IN})/R_{in}$.

According to another aspect of the invention, the control circuit includes a current mirror having an input which together with an inverting output of the differential input cell supplies the input current dI. Each of the current mirror input and the inverting output of the differential cell supply part, and preferably half, of the input current dI. Since the current mirror only mirrors part of the input current dI, any errors due to process variations in manufacturing the current mirror transistors is significantly reduced as compared to the known circuit in which the current mirror mirrors the entire input current.

According to yet another aspect of the invention, a pair of output devices each coupled to a respective one of the inverting and non-inverting outputs of said differential output cell convert the differential output current to a differential output voltage. Each of the pair of output devices has a resistance $R_{out}$, the differential output voltage being at least substantially equal to $(I_{cout}/I_{cin})$ $(R_{out}/R_{in})$ $(V_{ref}-V_{in})$.

According to still another aspect of the invention, error is further reduced as compared to the known circuit by equalizing the collector voltages of the bipolar transistors forming the current mirror. This is accomplished in a simple manner with a second differential amplifier according to an embodiment.

According to yet another aspect of the invention, temperature compensation is achieved by biasing the differential input cell with a constant current and the differential output cell with a temperature compensated current.

According to another aspect of the invention, a common mode control circuit controls the common mode current of the differential amplifier.

According to still another aspect of the invention, a VGA includes such a voltage converting multiplier converter circuit, thus providing a simplified VGA which receives a single ended gain control voltage and outputs a temperature compensated current having a linear-in-dB relationship with the gain control voltage.

Yet another aspect of the invention concerns a method of controlling a gilbert cell multiplier having a differential input cell and a differential output cell to convert a singled ended input voltage into a differential output voltage.

These and other object, features and advantages of the invention will become apparent with reference to the following detailed description and the drawings.

BRIEF DESCRIPTION OF THE DRAWINGS

FIG. 2(*b*) is a circuit diagram of a prior art Gilbert cell multiplier and FIG. 2(*a*) is a circuit diagram of a prior art voltage-to-current converter for driving the Gilbert cell of FIG. 2(*b;*

DETAILED DESCRIPTION OF THE PREFERRED EMBODIMENT

Figure 1:
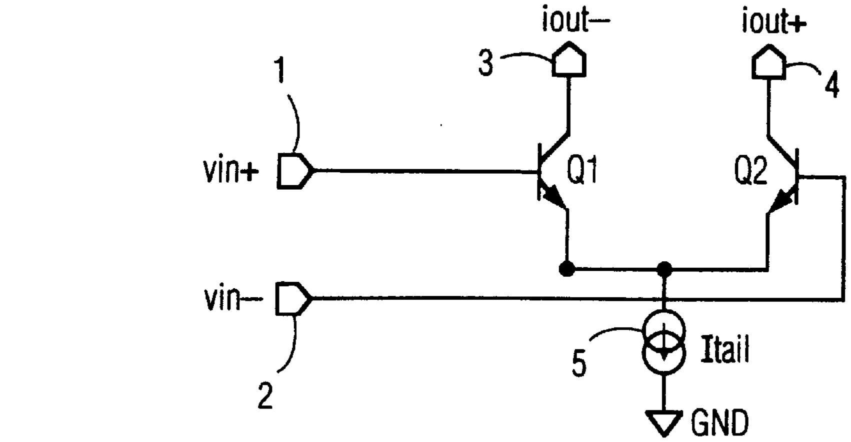
FIG. 1 PRIOR ART
FIG. 1 shows a differential pair of bipolar transistors (prior art)
Figure 3:
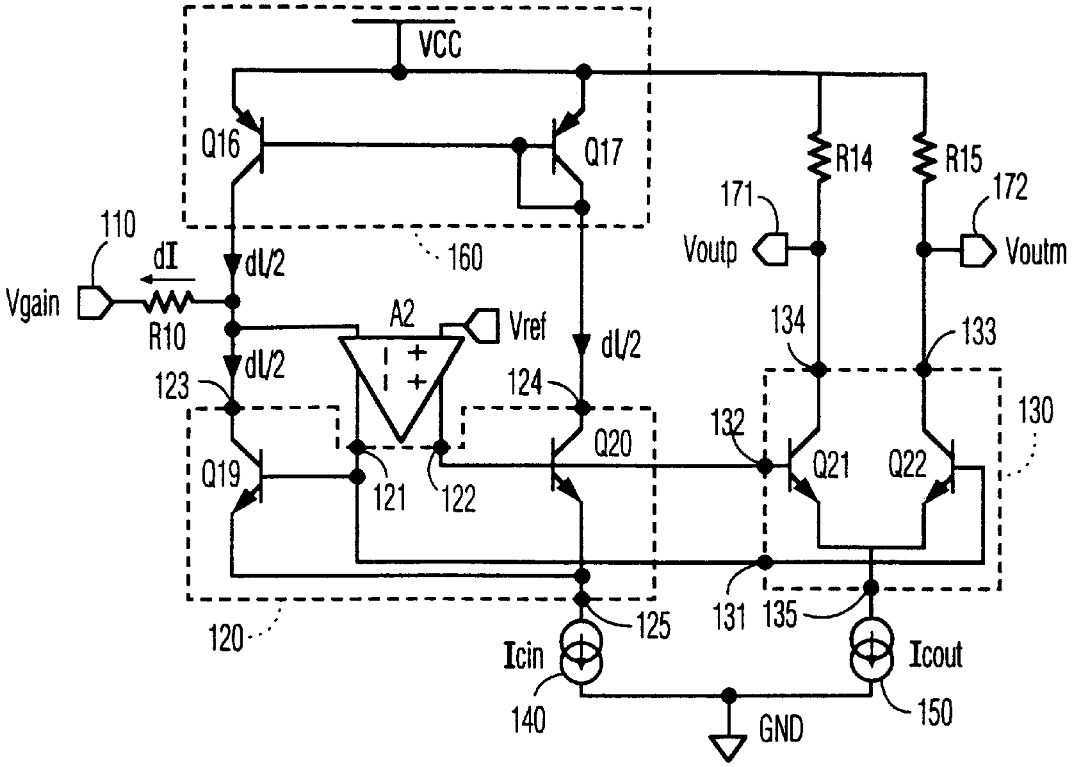
FIG. 3 is a circuit diagram of temperature compensating voltage converter circuit according to one embodiment of the invention.

FIG. 3 shows an improved voltage converting multiplier circuit 100 according to one embodiment of the invention which converts a single-ended, gain control input voltage $V_{gain}$ to a temperature compensated, differential output voltage $V_{outp}$, $V_{outm}$. This differential output voltage, when used to drive the inputs 1, 2 of the differential pair (transistors Q1, Q2 ) of FIG. 1, provides a collector current ratio of the differential pair Q1, Q2 which is exponentially proportional to the gain control voltage $V_{gain}$ ("linear-in-dB"), and independent of temperature.

Circuit 100 includes a multiplier cell having a differential input cell 120 including differential input transistors Q19, Q20 and a differential output cell 130 including differential output transistors Q21, Q22. Each differential cell includes, respectively, an inverting input 121, 131 and a non-inverting input 122, 132, an inverting output 123, 133, and a non-inverting output 124, 134. The outputs of the differential cells are formed by the respective collectors of the transistors Q19–Q22 while the inputs are formed by the respective bases of the transistors Q19–Q22. The differential cells 120, 130 are coupled in pairwise configuration, with the inverting inputs 121, 131 (or alternatively the bases of the transistors Q19, Q22 ) coupled together and the non-inverting inputs 122, 132 (or alternatively the bases of the transistors Q20, Q21 ) coupled together. The emitters of the transistors Q19, Q20 are commonly coupled at a control current terminal 125 of the differential input cell while the emitters of the output transistors Q21, Q22 are commonly coupled at a control current terminal 135 of the differential output cell.

Input terminal 110 receives a single ended input voltage $V_{gain}$. A control circuit includes an input resistor R10 having a resistance $R_{in}$, a differential amplifier A2 and a current mirror 160. Current mirror 160 includes bipolar transistors Q16, Q17 having their emitters coupled to a first supply terminal Vcc and their bases coupled to each other. The base of transistor Q17 is also connected to its collector. The differential amplifier A2 includes an inverting and a non-inverting input and an inverting and non-inverting output. The non-inverting input is coupled to receive a reference voltage $V_{ref}$. The inverting input of the amplifier A2 is coupled to one end of the input resistor R10, the other end of which is coupled to the input terminal 110. The non-inverting output of amplifier A2 is coupled to the non-inverting input 122 (the base of transistor Q20 ) and the inverting output is coupled to the inverting input 121 (the base of transistor Q19 ). The collectors of the current mirror transistors Q16, Q17 are coupled to respective outputs 123, 124 of the differential input cell.

Current source 140 biases the emitters of the transistors Q19, Q20 with a first bias current $I_{cin}$ via the current control terminal 125 while the current source 150 biases the emitters of the output transistors Q21, Q22 with a second bias current $I_{cout}$ via the current control terminal 135 of the differential output cell. The circuit 100 also includes a pair of resistors R14, R15, each coupled between $V_{cc}$ and a respective output 134, 135 of output cell 130.

The circuit of FIG. 3 operates as follows. The differential amplifier A2 nulls the difference between the voltages at its inverting and non-inverting inputs. This means that the input resistor R10 will see a voltage $V_{ref}$ at its end (right side in FIG. 3) connected to the inverting input of amplifier A2. When a gain control voltage $V_{gain}$ is applied at the input terminal 110, a current dI will flow out of the circuit, dI being equal to (Vref−Vgain)/$R_{in}$. The differential input pair Q19, Q20 is biased at a constant current $I_{cin}$, provided by current source 140, and is driven by the output of amplifier A2. The current dI is split and directly forced onto the input differential pair Q19, Q20. Half of the current (dI/2) flowing out through input terminal 110 is supplied by the input transistor Q19, and the other half is supplied by the other input transistor Q20, through the current mirror 160 formed by the transistors Q16 and Q17. The current difference in the two branches of the differential input cell, i.e. the difference in collector currents of the input pair Q19 and Q20 is therefore dI, due to the flow of current dI/2 in opposite directions in transistors Q8, Q9. The current gain of the circuit 100 is set by the ratio of the tail currents $I_{cin}$ and $I_{cout}$, so the difference in collector currents $dI_{out}$ of the differential output pair Q21 and Q22 equals $$dI_{out} = \frac{I_{cout}}{I_{cin}} dI \tag{5 a}$$

Substituting the above expression for dI yields $$dI_{out} = \frac{I_{cout}}{I_{cin}} \left( \frac{V_{gain} - V_{ref}}{R_{in}} \right) \tag{5 b}$$

This current difference dIout between the collector currents of the output transistors Q21, Q22 generates a differential output voltage $V_{outp}$, $V_{outm}$ at the output terminals 171, 172 across the resistors R14 and R15. Selecting resistors R14, R15 equal to each other with a resistance $R_{out}$, the differential output voltage $V_{do}$ the output terminals $V_{outp}$, $V_{outm}$ becomes $$V_{do} = V_{outp} - V_{outm} = R_{4,5} dI_{out} = \frac{I_{cout}}{I_{cin}} \frac{R_{out}}{R_{in}} (V_{gain} - V_{ref}) \tag{6}$$

A temperature compensated output is achieved when the current source 140 provides a constant current $I_{const}$ and the current source 150 provides a temperature compensation current $I_{ptat}$. Current sources suitable for the constant current source 120 and the temperature compensating source 210 are well known in the art. Substituting for $I_{cout}$+$I_{cin}$, equation 6 becomes $$V_{do} = V_{outp} - V_{outm} = \frac{I_{ptat}}{I_{const}} \frac{R_{out}}{R_{in}} (V_{gain} - V_{ref}) \tag{7}$$

In this expression, it is the ratio $I_{ptat}/I_{const}$ that accounts for the desired temperature compensation.

Figure 2A:
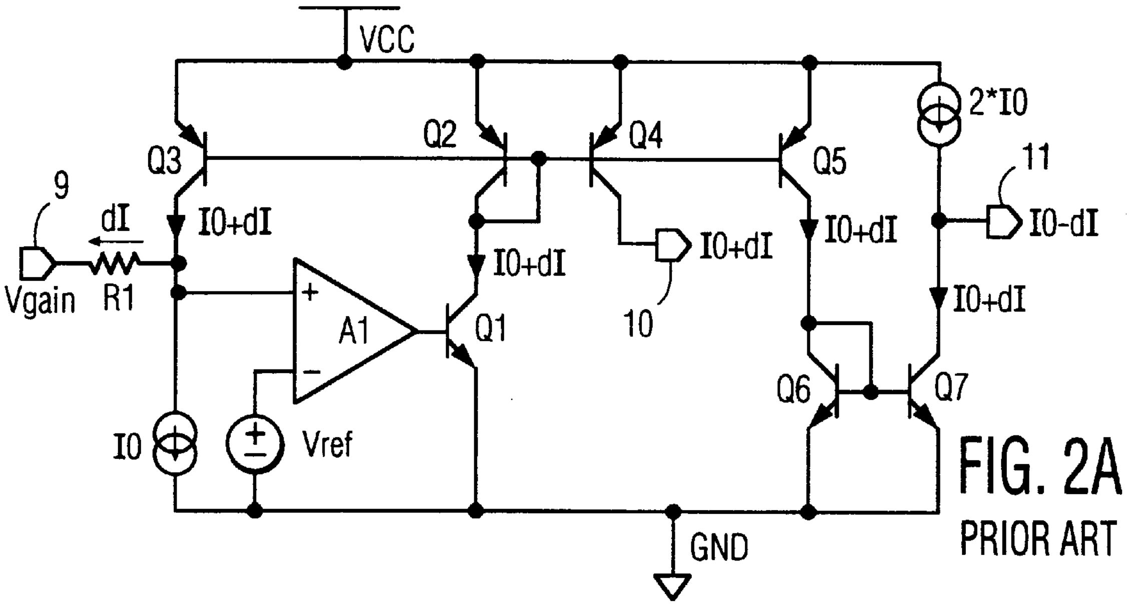
FIG. 2A PRIOR ART
FIGS. 2(*a*) and 2 (*b*) together illustrate the building blocks of a prior art temperature compensating voltage converter circuit.
Figure 2B:
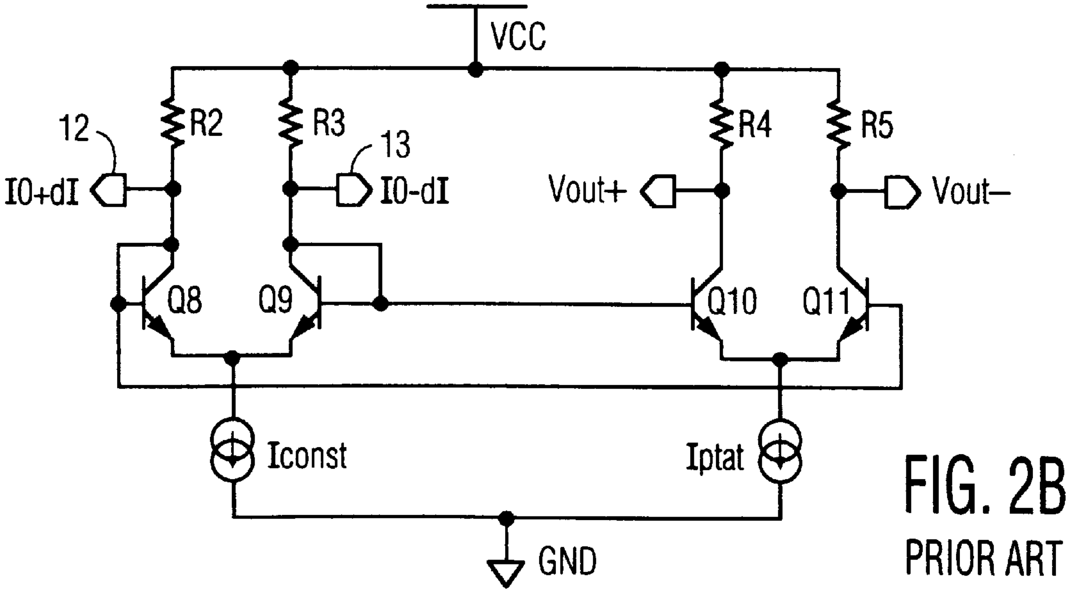
FIG. 2B PRIOR ART

Since the input current dI is directly forced onto the input transistors Q19 and Q20 of FIG. 3, the number of error mechanisms as compared to the prior art circuit in FIG. 2(*a*) is greatly reduced. Additionally, by providing the differential amplifier A2 within the multiplier circuit, the two separate functions of voltage-to-current conversion and current multiplication are merged into one circuit. This greatly improves accuracy and reduces die size (as evident from the reduced component count) as compared to the known configuration of FIGS. 2(*a*), 2(*b*).

While the circuit of FIG. 3 is not completely error free, the possible error is reduced as compared to the prior art circuit of FIG. 2. The main source of error arises from any random mismatch occurring during production of the transistors Q16, Q17 of the current mirror 160 and the fact that the collector voltages of these transistors are not equal. The effect of these errors is halved, however, as compared to the prior art circuit of FIG. 2(*a*), since the current through the current mirror 160 accounts for only half the current difference dI of the input transistors Q19, Q20. The splitting of the current dI is controlled by the current mirror ratio of the current 160. It should be noted that ideally the current dI should be split equally, as any other proportioning only reduces accuracy of the circuit.

Figure 4:
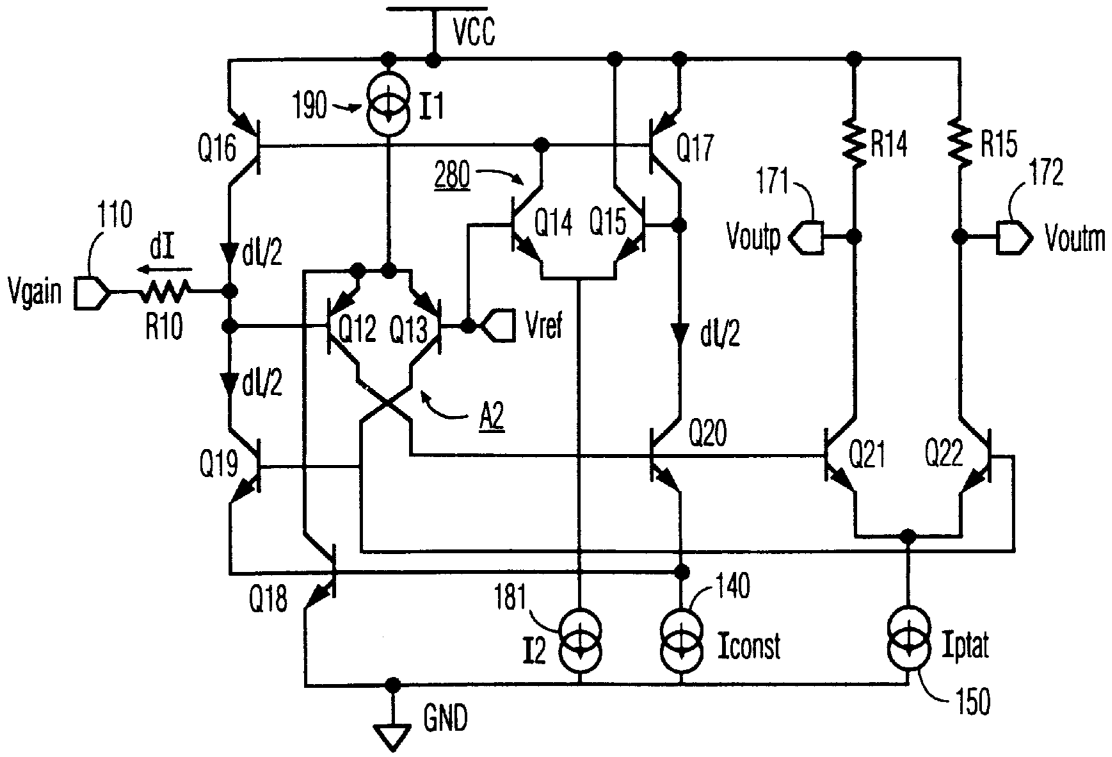
FIG. 4 is a circuit diagram of a temperature compensating voltage converter circuit according to a second embodiment of the invention.

FIG. 4 shows a second embodiment of the invention which further reduces the error of the circuit of FIG. 3. Circuit elements corresponding to those of FIG. 3 bear the same reference numerals. The circuit of FIG. 4 equalizes the collector voltages of the transistors Q16 and Q17. This is accomplished by replacing the direct base-collector diode connection of the transistor Q17 of FIG. 3 by a differential amplifier 180 that fixes the collector voltage of the transistor Q17 to the reference voltage $V_{ref}$, which is the same voltage as found on the collector of the transistor Q16. The differential amplifier 180 for the current mirror 160 is implemented by the bipolar transistors Q14 and Q15 and the current source 181. Transistor Q15 has its base coupled to the emitter of the transistor Q17 and its collector coupled to the supply Vcc. Transistor Q14 has its base coupled to receive the reference voltage $V_{ref}$ and its collector coupled to the bases of the transistors Q16 and Q17. The emitters of transistors Q14, Q15 are commonly coupled to and biased by the current source 181 which provides a biasing current I2. Transistor Q14, Q15 and Q17 form a feedback loop which maintains the same voltage at the base of Q15 and the collector of Q17, as is known in the art.

FIG. 4 also provides a detailed schematic for the amplifier A2 of FIG. 3. It consists of the transistors Q12 and Q13 that form a differential pair, and a current source 190 which provides a biasing current I1 for this differential pair. Transistor Q18 establishes the common mode level of the amplifier 130, as is also known in the art.

Thus it will be understood that the converter circuits of FIGS. 3 and 4 convert a single ended input voltage into a differential signal. The output signal is the differential collector currents of the transistors Q21, Q22. This differential output current provides a voltage drop across the resistors R14, R15 which provides a differential output voltage. This output signal is temperature compensated when the control currents for the input and output cells are $I_{const}$ and $I_{ptat}$. Coupling the converter circuit of either FIGS. 3 or 4 to drive the differential pair of FIG. 1 provides a compact, accurate VGA with a single ended input which produces a temperature compensated differential output current having collector current ratio which is linear-in-db. Such a VGA is useful in numerous applications, and particularly in automatic gain control circuits for radio transceivers, such as in cellular phones.

Although preferred embodiments of the present invention have been shown and described, it will be appreciated by those skilled in the art that changes may be made in these embodiments without departing from the principles and spirit of the invention, the scope of which is defined in the claims. For example, those of ordinary skill in the art will appreciate that the current mirror transistors may be FET's instead of the bipolar transistors shown. Additionally, while bipolar transistors are shown for the multiplier cell transistors Q19–Q22 because of their exponential gain characteristics, those of ordinary skill in the art will appreciate that for some applications, FET's may be substituted which operate in their sub-threshold region, since in this region FET's also exhibit an exponential gain characteristic.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A voltage converting multiplier circuit for converting a single ended voltage to a differential output signal, comprising:

an input terminal which receives an input voltage $V_{gain}$;

a multiplier circuit comprising a differential input cell and a differential output cell, each differential cell including an inverting input, a non-inverting input, an inverting output and a non-inverting output, and a control current terminal, the inputs of said differential input cell being coupled to respective ones of the inputs of said differential output cell; and a control circuit coupled to said input terminal and said multiplier circuit and which receives a reference voltage $V_{ref}$, converts the input voltage to an input current dI proportional to the difference between the reference voltage $V_{ref}$ and the input voltage $V_{gain}$, divides the input current and applies the divided input current to the inverting and non-inverting outputs of said differential input cell such that the inverting and non-inverting outputs of said differential output cell output a differential output current $dI_{out}$ proportional to dI $(I_{cout}/I_{cin})$, where $I_{cout}$ is a control current applied to said control current terminal of said differential output cell and $I_{cin}$ is a control current applied to said control current terminal of said differential input cell; and a pair of output devices each coupled to a respective one of the inverting and non-inverting outputs of said differential output cell to convert the differential output current to a differential output voltage.

2. A voltage converting multiplier circuit according to claim 1, wherein said control circuit includes an input device having a resistance $R_{in}$ coupled to said input terminal such that said input current dI equals $(V_{ref}-V_{in})/R_{in}$.

3. A voltage converting multiplier circuit according to claim 1, wherein each of said pair of output resistances has a resistance $R_{out}$, the differential output voltage being equal to $(I_{cout}/I_{cin})$ $(R_{out}/R_{in})$ $(V_{ref}-V_{in})$.

4. A voltage converting multiplier circuit according to claim 1, wherein said control circuit includes an input device having a resistance, said input device having a first end coupled to said input terminal and a second end, and a differential amplifier having an inverting input coupled to said second end of said input device, an inverting input which receives the reference voltage, an inverting output coupled to the inverting input of said input differential cell and a non-inverting output coupled to said non-inverting input of said differential input cell, said differential amplifier controlling the input differential cell to maintain a voltage at said second end of said input device equal to $V_{ref}$.

5. A voltage converting multiplier circuit according to claim 4, further comprising a circuit which controls the common mode current of said differential amplifier.

6. A voltage converting multiplier circuit according to claim 1, wherein said control circuit includes a current mirror having an input which together with said inverting output of said input differential cell supplies said input current dI, each of the current mirror input and said inverting output of said differential cell supplying approximately half of said input current dI, and said current mirror having an output coupled to the non-inverting output of said differential input cell and supplying a current of approximately dI/2 thereto.

7. A voltage converting multiplier circuit according to claim 6, wherein said current mirror includes a pair of bipolar transistors each having a collector coupled to a respective one of said inverting and non-inverting outputs of said differential input cell, and further comprising a differential amplifier which equalizes the collector voltages of said current mirror to the reference voltage $V_{ref}$.

8. A voltage converting multiplier circuit according to claim 1, wherein each of said differential input cell and said differential output cell comprises a pair of differentially coupled bipolar transistors, one transistor of each pair of bipolar transistors having a base comprising said inverting input and a collector comprising said inverting output, and the other transistor of each pair of bipolar transistors having a base comprising said non-inverting input and a collector comprising said non-inverting output, and each transistor of a respective said pair of bipolar transistors having an emitter commonly coupled to the respective said control current terminal.

9. A voltage converting multiplier circuit for converting a single ended gain control voltage to a differential, temperature-compensated voltage, said converter circuit comprising:

an input terminal which receives a gain control voltage $V_{gain}$;

a multiplier circuit comprising a differential input cell and a differential output cell, each differential cell including an inverting input, a non-inverting input, an inverting output and a non-inverting output, and a control current terminal, each of the inputs of said differential input cell being coupled to a respective one of the inputs of said differential output cell; and a control circuit including (i) an input device having a first end coupled to said input terminal and a second end coupled to said inverting output of said differential input cell, said input device having a resistance $R_{in}$, (ii) a current mirror having an input coupled to said second end of said input device and to said inverting output of said differential input cell, said current mirror further including an output coupled to said non-inverting output of said differential input cell, and (iii) a differential amplifier which receives a reference voltage $V_{ref}$ and controls the inverting and non-inverting inputs of said differential input cell to maintain a voltage at said second end of said input device equal to the reference voltage $V_{ref}$ thereby inducing a current of approximately dI/2 to flow through said input device from each of (i) said current mirror input and (ii) said inverting output of said differential input cell, whereby $dI=(V_{ref}-V_{gain})/R_{in}$, the output of said current mirror supplying a current of approximately dI/2 to said non-inverting output of said differential input cell;

a first, constant current source which supplies a constant current $I_{const}$ to said control current terminal of said differential input cell;

a second, temperature compensated current source which supplies a temperature compensated current $I_{ptat}$ to said control current terminal of said differential output cell; and a pair of output devices each coupled to a respective one of the inverting and non-inverting outputs of said differential output cell, both of said output devices having a resistance $R_{out}$, and a pair of differential output terminals each coupled to a respective one of the output devices and outputting a respective differential, temperature-compensated gain control voltages $V_{outm}$, $V_{outp}$, whereby $(V_{outp}-V_{outm})$ is at least substantially equal to $(I_{ptat}/I_{const})$ $(R_{out}/R_{in})$ $(V_{gain}-V_{ref})$.

10. A voltage converting multiplier circuit according to claim 9, wherein each of said differential input cell and said differential output cell comprises a pair of differentially coupled bipolar transistors, one transistor of each pair of bipolar transistors having a base comprising said inverting input and a collector comprising said inverting output, and the other transistor of each pair of bipolar transistors having a base comprising said non-inverting input and a collector comprising said non-inverting output, and each transistor of a respective said pair of bipolar transistors having an emitter commonly coupled to a respective said control current terminal.

11. A voltage converting multiplier circuit according to claim 9, further comprising a common mode control circuit which controls the common mode current of said differential amplifier.

12. A voltage converting multiplier circuit according to claim 9, wherein said differential amplifier comprises first and second bipolar transistors, said first bipolar transistor having a base coupled to said second end of said input device, a collector coupled to said non-inverting input of said differential input cell and an emitter, said second bipolar transistor having a base coupled to receive the reference voltage $V_{ref}$, a collector coupled to the inverting input of said differential input cell and an emitter coupled in common with said emitter of said first bipolar transistor, and a third current source biasing the emitters of said first and second bipolar transistors.

13. A voltage converting multiplier circuit according to claim 9, wherein said current mirror includes a pair of bipolar transistors each having a collector coupled to a respective one of said inverting and noninverting outputs of said differential input cell, one of said transistors having a common base-emitter.

14. A voltage converting multiplier circuit according to claim 9, wherein said current mirror includes a pair of bipolar transistors each having a collector coupled to a respective one of said inverting and non-inverting outputs of said differential input cell, and further comprising a differential amplifier which equalizes the collector voltages of said current mirror to the reference voltage $V_{ref}$.

15. A single input temperature compensated variable gain amplifier, comprising:

a) a voltage converting and temperature compensating circuit comprising:

a single ended input for receiving a gain control voltage $V_{gain}$, said single ended input including a first resistive element having a first end receiving the gain control voltage and a second end, said first resistive element having a resistance $R_{in}$;

a first differential pair of transistors and a second differential pair of transistors, each transistor of said first and second pairs including a control terminal and a main current path, for each differential pair, the ratio of the currents through the main current paths of the transistors being an exponential function of a differential input voltage applied to the control terminals of said pair;

second and third resistive elements, each coupled to said main current paths of a respective one of said second differential pair, said second and third resistive elements each having a same resistance $R_{out}$;

a pair of differential outputs, each coupled to a respective one of said second and third resistive elements;

a constant current source coupled to the main current paths of said transistors of said first differential pair, said constant current biasing each of said transistors of said first differential pair with a constant current $I_{const}$;

a temperature compensated current source coupled to the main current paths of said transistors of said second differential pair, said temperature compensated current source biasing each of said transistors of said second differential pair with a current $I_{ptat}$ proportional to absolute temperature;

a differential amplifier having a pair of amplifier inputs and a pair of amplifier outputs, each of said pair of amplifier outputs being coupled to said control element of a respective transistor of said first differential pair, one of said amplifier inputs being coupled to said second end of said first resistive element and the other of said amplifier inputs being coupled to receive a reference voltage;

a current mirror which divides an input current at the singled ended input between said main current paths of said transistors of said first differential pair;

in response to a gain control voltage applied at said single ended input:

said differential amplifier producing a differential control voltage at said control terminals of said transistors of said first differential pair to maintain the voltage at said second end of said first resistive element equal to the reference voltage, an input current dI flowing out of said single ended input proportional to the quotient of (i) the difference between the reference voltage and the gain control voltages and (ii) the resistance of said first resistive element, said current mirror dividing the input current substantially equally between the main current paths of said transistors of said first differential pair, and the differential voltage at said differential output terminals being at least substantially equal to $$\left(\frac{R_{out}}{R_{in}}\right)\left(\frac{I_{ptat}}{I_{const}}\right)(dI);$$

b) a gain control amplifier comprising a third differential pair of transistors and a third current source, each transistor of said third pair including a control terminal and a main current path, the control terminal of the third pair being coupled to receive the differential voltage from said voltage converting and temperature compensating circuit, the ratio of the currents through the main current paths of the transistors of said third pair being an exponential function of the differential voltage, the third current source commonly biasing the emitters of said third differential pair of transistors, and the ratio of the currents of said third differential pair being exponentially proportional to the gain control voltage $V_{gain}$ and independent of temperature.

16. A variable gain amplifier according to claim 15, wherein each of said transistors of said first, second and third differential pairs is a bipolar transistor having a base comprising said control terminal, and a collector and an emitter between which extends said main current path, and each of said current sources biasing the emitters of the respective differential pair of transistors.

17. A variable gain amplifier according to claim 15, wherein said current mirror comprises a pair of bipolar current mirror transistors having bases coupled to each other, one of said bipolar transistors having a collector coupled to the base of said one transistor.

18. A variable gain amplifier according to claim 15, wherein said current mirror comprises first and second bipolar current mirror transistors each having a collector, an emitter and a base, said bases of said current mirror transistors being coupled to each other, one of said current mirror transistors having a collector coupled to the second end of said first resistive element, and further comprising equalizing means for equalizing the voltage at the collector of said second current mirror transistor to the voltage at the collector of said first current mirror transistor.

19. A variable gain amplifier according to claim 18, wherein said equalizing means comprises a second differential amplifier having a first input coupled to said reference voltage source and a second input coupled to the collector of said second current mirror transistor.

20. A variable gain amplifier according to claim 19, further comprising a device which controls the common mode current of said differential amplifier.

21. A variable gain amplifier according to claim 20, wherein said device comprises a bipolar transistor having a base commonly coupled to the emitters of said transistors of said first differential pair.

22. A voltage converting multiplier circuit for converting a single-ended voltage to a differential output signal, comprising:

multiplier means comprising a differential input means and a differential output means coupled to each other for multiplying a differential input current applied to the differential input means by the ratio $I_{cout}/I_{cin}$ of two control currents $I_{cout}$ and $I_{cin}$ to produce a differential output signal at outputs of the differential output cell, said differential output means being biased by the control current $I_{cout}$ and said differential input means being biased by the control current $I_{cin}$, the control current $I_{cin}$ being a constant current and the control current $I_{cout}$ being a temperature compensated current; and means for receiving a single-ended input voltage $V_{gain}$ converting the input voltage $V_{gain}$ to an input current, dividing the input current and applying the divided input current as said differential input current to said differential input means.

23. A method of converting a single ended input voltage to a differential output signal using a multiplier circuit having a differential input cell and a differential output cell coupled to each other to produce a differential output current which is proportional to the product of (i) a differential input current applied to said differential input cell and (ii) the quotient of an output control current and an input control current applied to the output and input differential cells, respectively, said method comprising the steps of:

receiving an input voltage $V_{gain}$;

converting the input voltage to an input current dI proportional to the difference between a reference voltage $V_{ref}$ and the input voltage $V_{gain}$;

dividing the input current;

biasing the differential input cell with the input control current;

biasing the differential output cell with the output control current, the input control current being a constant current and the output control current being temperature compensated current; and applying the divided input current to the differential input cell as the differential input.

24. A method according to claim 23, further comprising the step of converting the differential output current to a differential output voltage.

* * * * *